United States Patent
Kuo

[19]

[11] Patent Number: 6,017,185
[45] Date of Patent: Jan. 25, 2000

[54] FAN FIXING STRUCTURE OF A RADIATOR

[75] Inventor: Dah-Chyi Kuo, Taipei, Taiwan

[73] Assignee: Chaun-Choung Industrial Corp., Taipei, Taiwan

[21] Appl. No.: 09/133,191

[22] Filed: Aug. 13, 1998

[51] Int. Cl.[7] .................................................. F04D 29/58
[52] U.S. Cl. .................. 415/177; 415/213.1; 415/214.1; 165/80.3; 165/121; 174/16.3; 361/687; 361/697
[58] Field of Search ..................................... 415/176, 177, 415/178, 213.1, 214.1; 165/80.3, 121; 257/718, 719, 722; 174/16.3; 361/687, 694, 695, 697

[56] References Cited

U.S. PATENT DOCUMENTS

| | | |
|---|---|---|
| 5,522,700 | 6/1996 | Hong ........................................ 415/177 |
| 5,590,025 | 12/1996 | Clemens .................................... 361/695 |
| 5,677,829 | 10/1997 | Clemens .................................... 361/697 |
| 5,734,553 | 3/1998 | Hong ........................................ 361/697 |
| 5,788,566 | 8/1998 | McAnally et al. ...................... 415/213.1 |
| 5,947,192 | 9/1999 | Kuo .......................................... 165/80.3 |

*Primary Examiner*—Christopher Verdier
*Attorney, Agent, or Firm*—Rosenberg, Klein & Lee

[57] ABSTRACT

A fan fixing structure of a radiator comprises a supporting frame and four fixing pins. The supporting frame has a plate and a through hole is installed on the center of the plate. The plate is connected with four supporting legs. The four fixing pins are integrally fixed on the four corners of the plate of the supporting frame for fixing a fan. The plate may be located on the fins of the radiator, and the four supporting legs are fixedly locked on the upper and lower sides of the base by screws so that the fan is combined with the radiator in order to dissipate the heat emitting from the fan. Integrally, the fan fixing structure has a preferred adapting ability and may be used in various kinds of radiators.

3 Claims, 4 Drawing Sheets

FAN FIXING STRUCTURE OF A RADIATOR

BACKGROUND OF THE INVENTION

1. Field of the Invention

The present invention relates to a fan fixing structure of a radiator, especially to a fan fixing structure suitable for a stand CPU radiator.

2. Background of the Invention

The radiator is a heat dissipating device used in the CPU of a computer (central processing unit) or electronic components. The prior art radiator is made of aluminum, copper and other materials with good conductivity by compressing aluminum pieces or pressing molding. The prior art radiator includes a base and a plurality of fins connected with the base. In order that the radiator has a preferred heat dissipating effect, in generally a fan is combined with the radiator for assisting to dissipate heat. However, it is necessary to fix the fan on the radiator with a proper fixing structure.

However, since the prior art radiator has various types, the fan fixing structure is not suitable. Therefore, various kinds of fan fixing structures are needed for different kinds of fans, thus the producing cost is increased. If the structure of the radiator has a sight variation, the mold for a new fan fixing structure is necessary to be designed. This is very inconvenient for the manufacturers. Therefore, in practice, the prior art fan fixing structure is inconvenient and has some defects necessary to be improved.

Further, if the prior radiator in used im a stand CPU, in order to match the requirement of the stand CPU, it needs to have a long shape, so that a hollow space is formed between the fins, thus the gas flow generated by the fan is flows easily outwards and is difficult to be transferred to the fins on the left and right sides of the long radiator. Thus the heat dissipation efficiency of the radiator will be greatly reduced. Therefore, it is apparently that there are some defects in the prior art radiator. This is needed to be improved.

SUMMARY OF THE INVENTION

Accordingly, the object of the present invention is to provide a fan fixing structure of a radiator comprising a supporting frame and four fixing pins. The supporting frame plate and a through hole are installed on the center of the plate. The plate is connected with four supporting legs. The four fixing pins are integrally fixed on the four corners of the plate of the supporting frame for fixing a fan. The plate may be located on the fins of the radiator, and the four supporting legs are fixed locked on the upper and lower sides of the base by screws. The fan fixing structure of the present invention is fixed on the base of the radiator by the through holes on the four supporting legs and screws. Therefore, no matter what the type of the fins in the radiator is, the fan fixing structure of the present invention may be fixed on the radiator. The fan fixing structure of the present invention has a preferred adapting ability for various kinds of radiators. Thus the cost is reduced and the using effect is increased.

The present invention will be better understood and its numerous objects and advantages will become apparent to those skilled in the art by referencing to the following drawings in which:

DETAILED DESCRIPTION OF TIE PREFERRED EMBODIMENT

Figure 1:
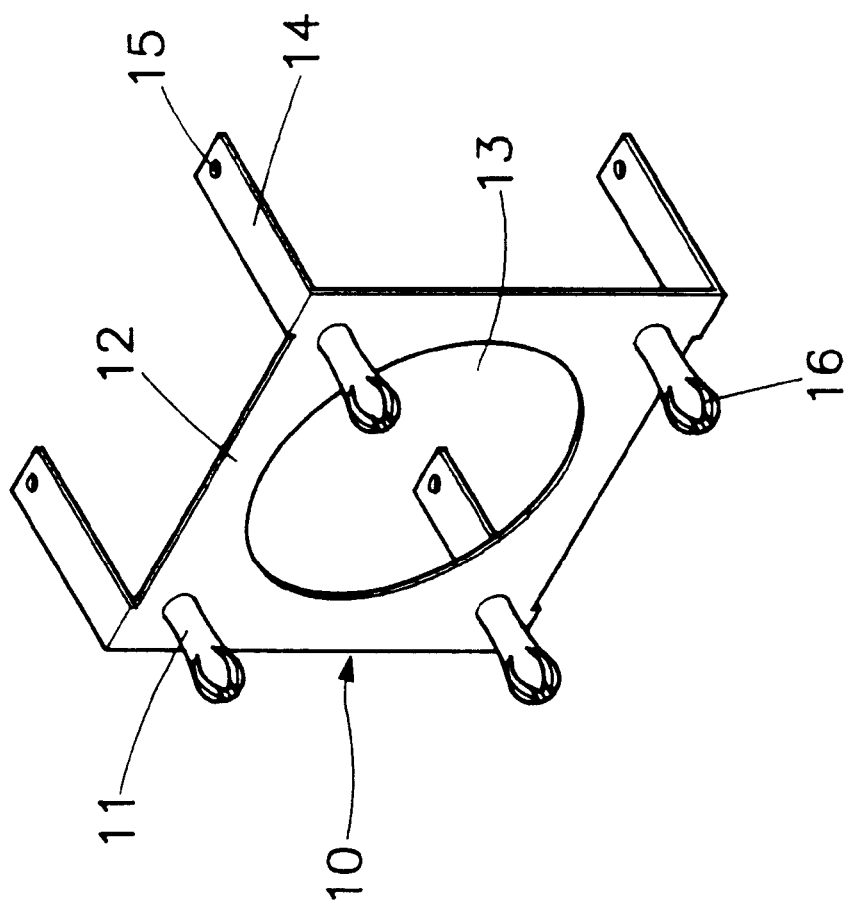
FIG. 1 is a perspective view of the present invention

As shown in FIG. 1, a fan fixing structure of a radiator is disclosed. The fan fixing structure is made by a plastic material and is formed by a supporting frame 10 and four fixing pins 11. The supporting frame 10 has a rectangular plate 12. A round through hole 13 is installed on the center of the plate 12. Each of the upper and lower sides of the plate 12 is connected with a vertical supporting leg 14 each end of which is installed with a through hole 15. The four fixing pins 11 are integrally fixed on the four corners of the plate 12 of the supporting frame 10. In order that the fan may be assembled conveniently, slots 16 are installed on each of the fixing pins 11 so that the outer diameters of the fixing pin 11 may be changed.

Figure 2:
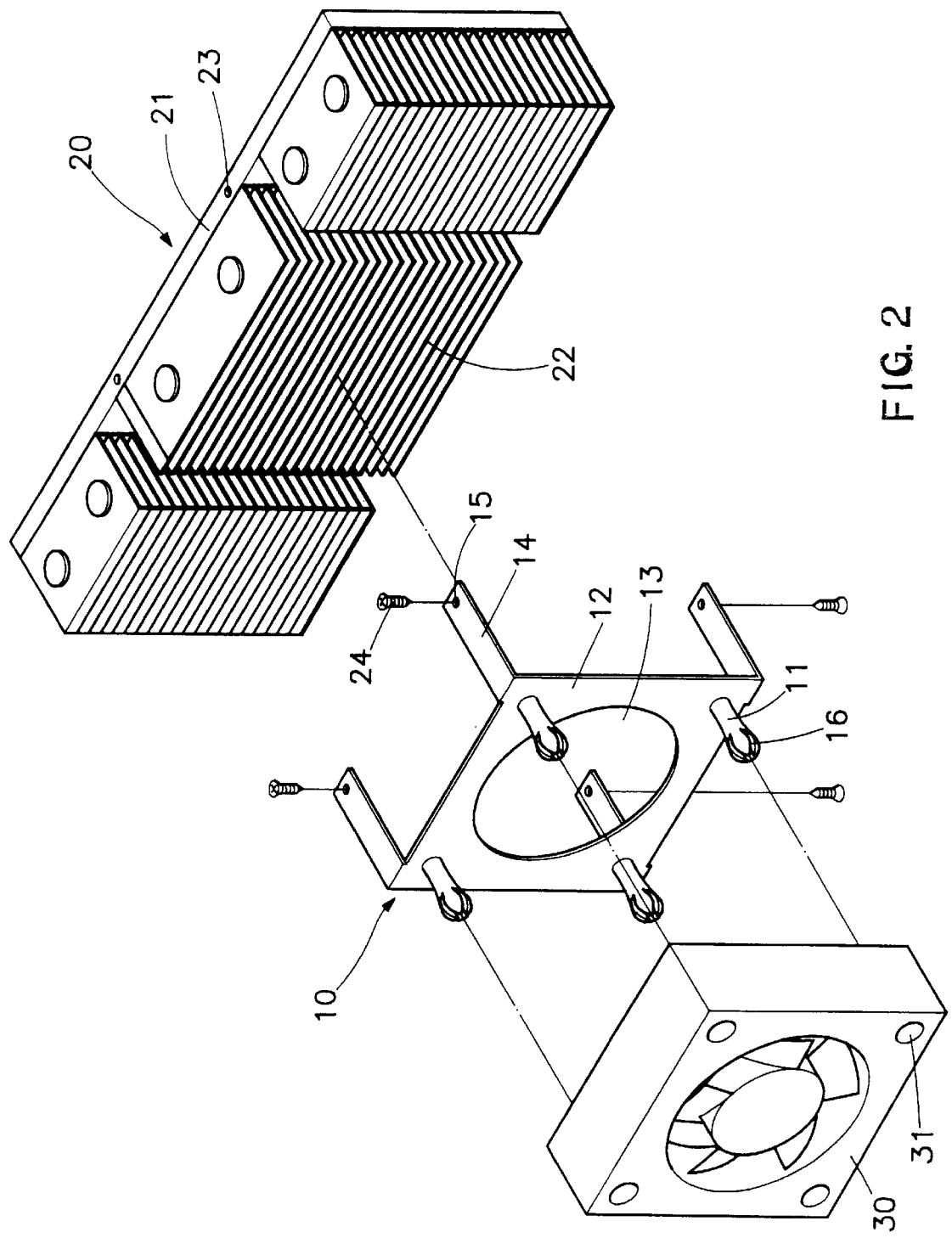
FIG. 2 is an exploded view of the fan fixing structure of the present invention, a radiator and a fan.
Figure 3:
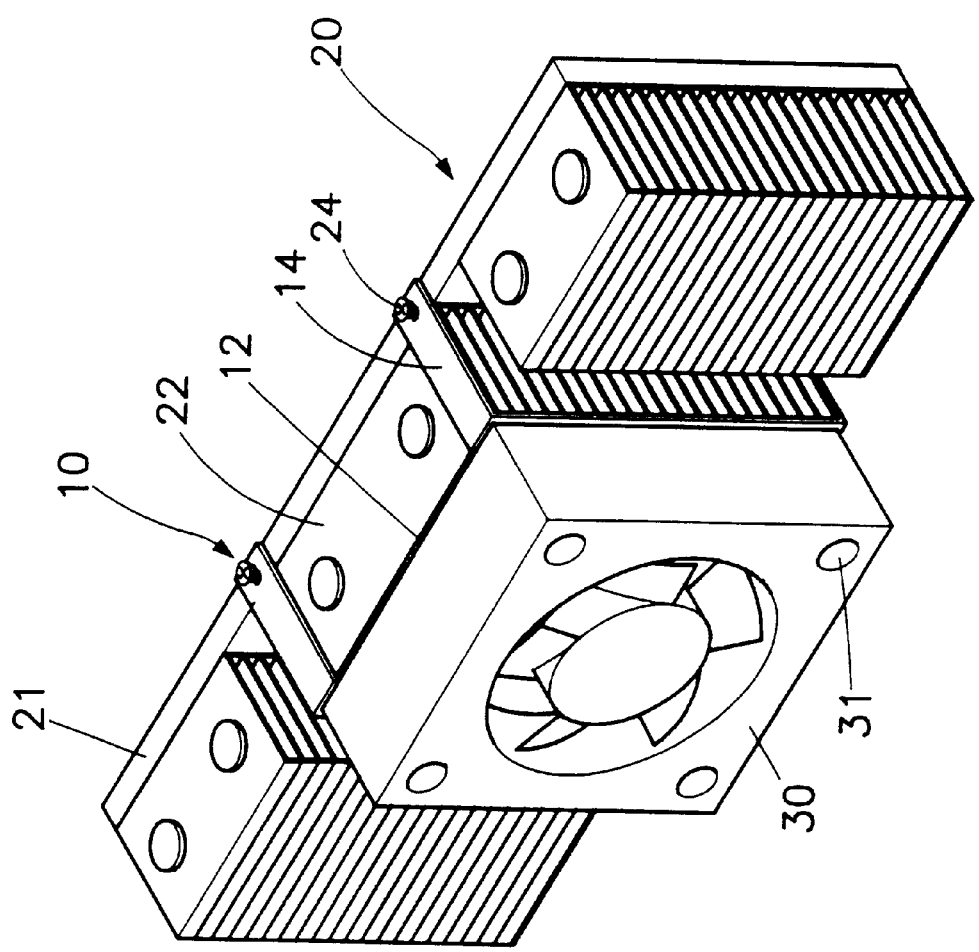
FIG. 3 shows the assembly of the fan fixing structure of the present invention, a radiator and a fan.

As shown in FIGS. 2 and 3, the fan fixing structure of the present invention may be fixed on a stand radiator 20 of a CPU. The radiator 20 has a base 21. A plurality of fins 22 are connected on the base 21. In the present invention, the plate 12 is located on the fins 22 on the medium portion of the radiator 20. The through holes 15 of the four supporting legs 14 are respective to the guide holes 23 on the upper and lower sides of the base 21 and the radiator 20. They are connected with the through holes 15 and the guide holes 23 by screws (self-tapping screws) so that the four supporting legs 14 are fixedly locked on the upper and lower sides of the base 21, thus the fan fixing structure may be combined with the radiator 20. A fan 30 is located on the plate 12 and is tightly inserted into the fixing holes 31 on the four corners of the fan 30 so that the fan 30 may be fixed on the plate 12. Therefore, the fan 30 is fixed on the radiator 20 by the fixing structure for increasing the function of heat dissipation.

Figure 4:
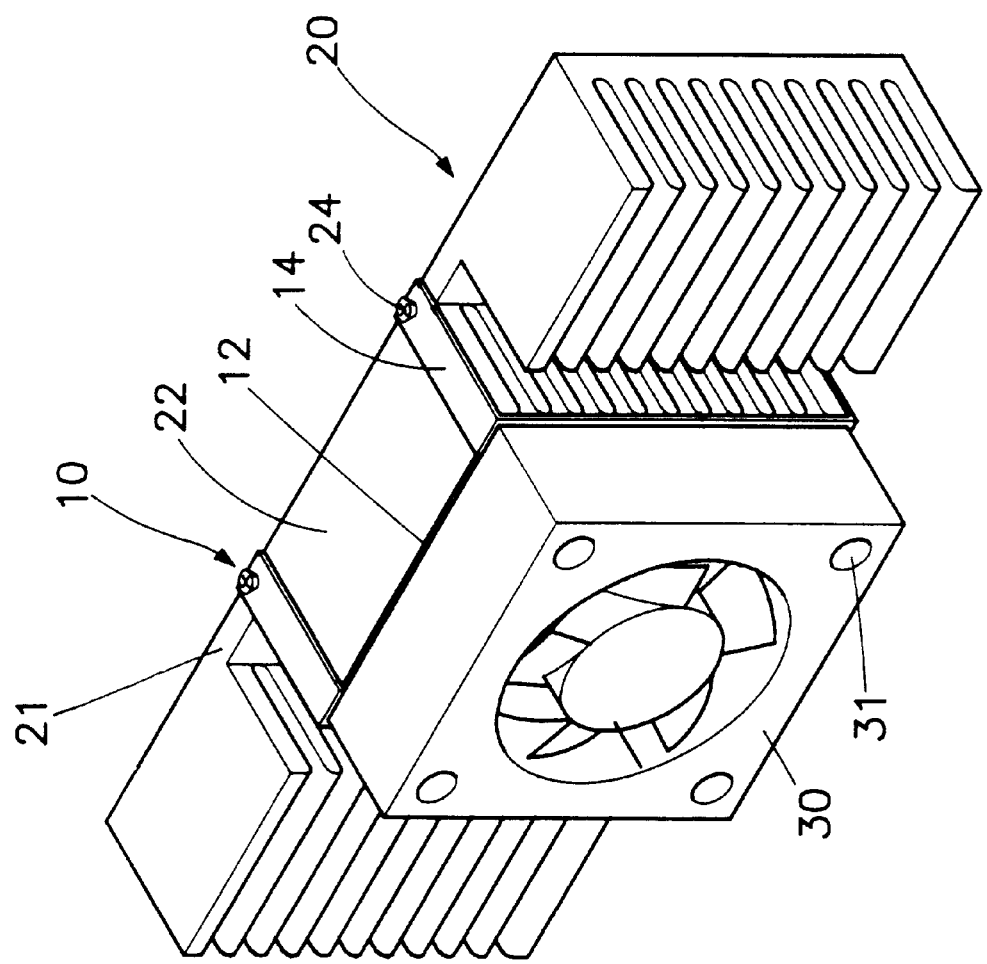
FIG. 4 is a perspective view of the fan fixing structure of the present invention, another type of radiator and a fan.

As shown in FIG. 4, the fan structure of the present invention may be fixed on another type of stand CPU radiator 20 having a base 21 and a plurality of fins 22. In the present invention, the radiator 20 may be located on the fins in the medium portion of the radiator 20 and the four supporting legs 14 are also fixedly locked on the upper sides and lower sides of the base 21, so that the fixing structure of the fan may be combined on the radiator 20.

The fan fixing structure of the present invention is fixed on the base 21 of the radiator 20 by the through holes 15 on the four supporting legs 14 and screws 24. Therefore, no matter what the type of the fins in the radiator is, the fan fixing structure of the present invention may be fixed on the radiator. The fan fixing structure of the present invention has a preferred adapting ability for various kinds of radiators. Thus the cost is reduced and the using effect is increased.

Although certain preferred embodiments of the present invention have been shown and described in detail, it should be understood that various changes and modifications may be made therein without departing from the scope of the appended claims.

Description of the Numerals in Figures.

| | |
|---|---|
| 10 supporting frame | 11 fixing pin |
| 12 plate | 13 through hole |
| 14 supporting leg | 15 through |
| 16 slot | |

| | |
|---|---|
| -continued | |
| 20 radiator | 21 base |
| 22 fin | 23 guide hole |
| 24 screw | |
| 30 fan | 31 fixing hole |

What is claimed is:

1. A fan fixing structure of a radiator comprising a supporting frame and four fixing pins, wherein the supporting frame has a plate, a through hole is installed on the center of the plate, each of the upper and lower sides of the plate is connected with a vertical supporting leg, each end of which is formed with a through hole, the four fixing pins are integrally fixed on the four corners of the plate of the supporting frame for fixing a fan, whereby the plate may be located on fins of the radiator, and is screwedly connected on the through holes of the supporting legs and guide holes on the upper and lower sides of the radiator, whereby the supporting legs are fixed on the upper and lower sides of a base of the radiator.

2. The fan fixing structure of a radiator as recited in claim 1, wherein slots are installed on each of the four fixing pins.

3. The fan fixing structure of a radiator as recited in claim 1, wherein the fan may be positioned on the plate, and by the four fixing pins on the plate, it is inserted into fixing holes on the four corners of the fan so that the fan is fixed on the plate.

* * * * *